United States Patent [19]

Casson et al.

[11] Patent Number: 5,709,979
[45] Date of Patent: Jan. 20, 1998

[54] PRINTED WIRING BOARD WITH PHOTOIMAGEABLE DIELECTRIC BASE SUBSTRATE AND METHOD OF MANUFACTURE THEREFOR

[75] Inventors: Keith L. Casson; Matthew John Saari; Raphael A. Marsolek; Marion Tibesar, all of Northfield, Minn.

[73] Assignee: Sheldahl, Inc., Northfield, Minn.

[21] Appl. No.: 327,236

[22] Filed: Oct. 21, 1994

[51] Int. Cl.$^6$ .................................................. G03F 7/00
[52] U.S. Cl. ..................... 430/311; 430/317; 156/643.1; 156/644.1
[58] Field of Search ................... 430/311, 313, 430/314, 315, 317, 327; 156/625.1, 630.1, 643.1, 644.1, 659.11

[56] References Cited

U.S. PATENT DOCUMENTS

| | | | |
|---|---|---|---|
| 5,112,462 | 5/1992 | Swisher | 205/165 |
| 5,137,791 | 8/1992 | Swisher | 428/612 |
| 5,364,707 | 11/1994 | Swisher | 428/612 |

OTHER PUBLICATIONS

*NOVAFLEX® HD Product Literature*, Sheldahl, Inc. (1994).
*Pyralux® PC Preliminary Data Sheet*, DuPont Electronics Material (May 24, 1994).

*Primary Examiner*—Kathleen Duda
*Attorney, Agent, or Firm*—Merchant, Gould, Smith, Edell, Welter & Schmidt, P.A.

[57] ABSTRACT

A printed wiring board includes a photoimageable dielectric material (PID) utilized as the base dielectric substrate therefor. The photoimageable dielectric material may be utilized in many conventional PWB designs, and improved resolution and registration precision of access apertures and through holes is generally realized through the use thereof. Moreover, less costly and complex manufacturing processes are required to deposit, image, develop and cure the PID material.

23 Claims, 6 Drawing Sheets

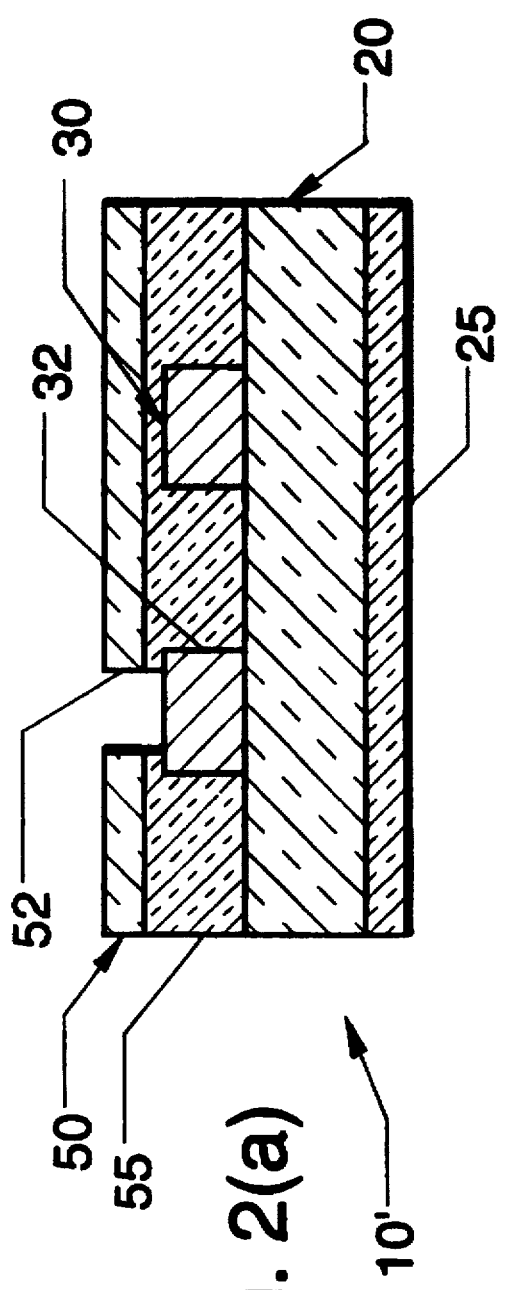
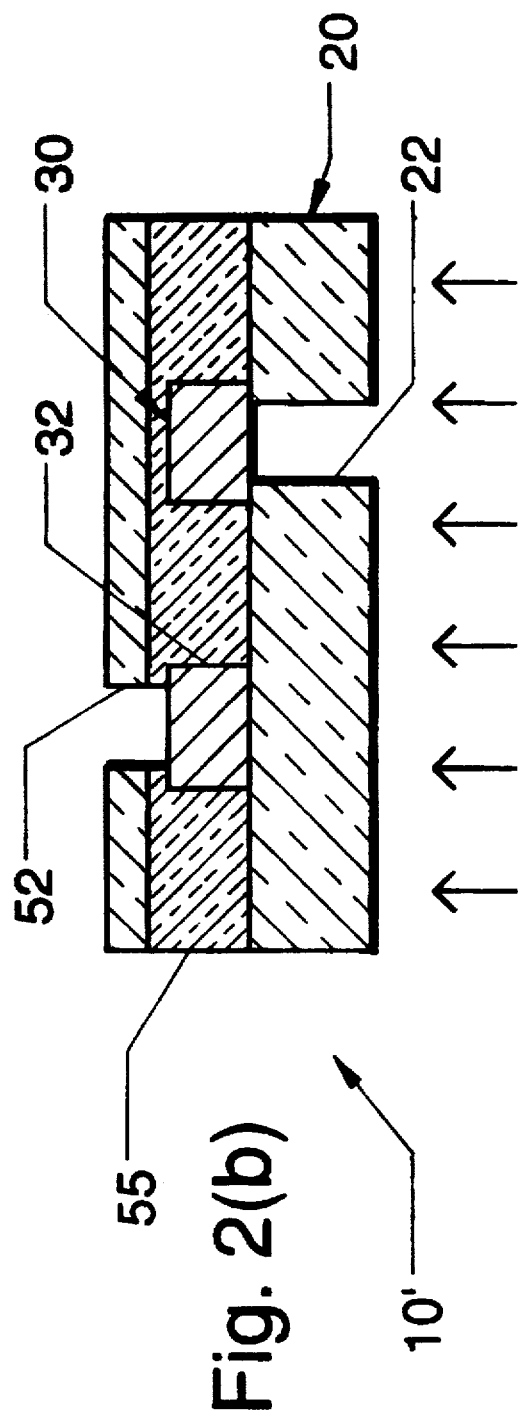

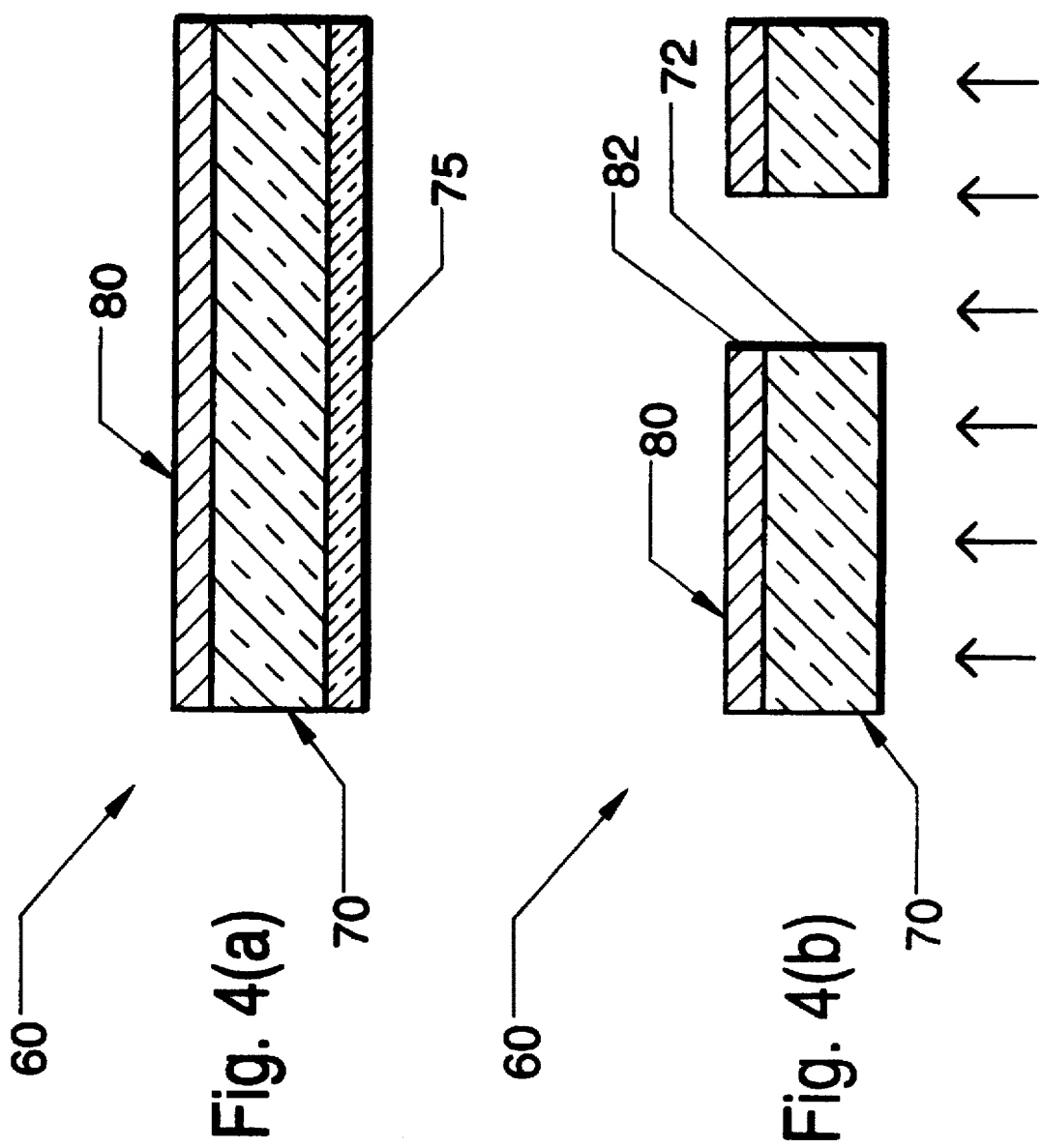

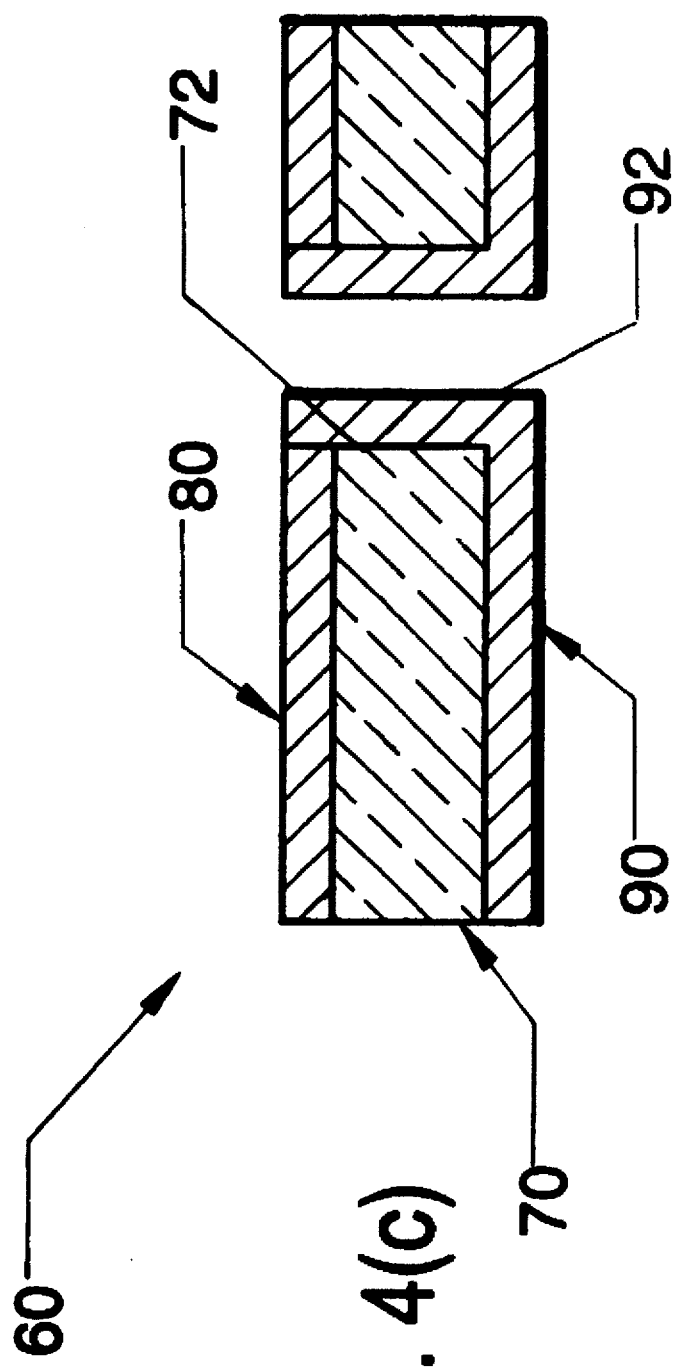

PRINTED WIRING BOARD WITH PHOTOIMAGEABLE DIELECTRIC BASE SUBSTRATE AND METHOD OF MANUFACTURE THEREFOR

FIELD OF THE INVENTION

The invention is directed to printed wiring boards and methods of manufacture therefor. More particularly, the invention is directed to printed wiring boards and methods of manufacture therefor which utilize photoimageable dielectric materials as base substrates.

BACKGROUND OF THE INVENTION

Many types of flexible printed wiring boards (PWB's) are commercially available. Typically, conventional PWB's include one or more layers of conductive material such as copper mounted on a dielectric base substrate, with cover layers deposited on one or both sides for insulating the conductive layers from the environment. Apertures in the cover layers are provided to facilitate electrical interconnection with points on the PWB.

One example of a conventional PWB is a single sided printed wiring board such as a back bared or reverse bared board, wherein a single layer of copper is sandwiched between a substrate and a cover layer, with access apertures formed in the base substrate and the cover layer to enable electrical interconnections on both sides of the PWB. Another type of PWB is a double sided printed circuit board which includes conductive layers disposed on both sides of a base dielectric substrate and electrically interconnected by one or more conductive through holes formed in the substrate. Electrical interconnections to the PWB are provided through apertures in cover layers that are bonded over one or both of the conductive layers.

Both types of flexible PWB's use flexible polymer films, such as polyimides, polyesters, PEN, etc. as base dielectric substrates. Apertures are typically formed in these substrates for use as access apertures (e.g., in single sided back bared designs) or as through holes (e.g., in double sided designs). These apertures are typically pre-punched or pre-drilled (e.g., by laser or mechanical drilling) at select points in the substrate. Mechanical drilling and punching operations are typically limited in resolution and registration (generally limiting apertures to 400 microns or more). Moreover, mechanical drilling and punching often requires additional tooling costs, and is not typically suited for roll-to-roll processing as are many other PWB manufacturing processes. Laser drilling may provide much finer resolution, however, additional steps of cleaning soot and other contaminants is often required.

Once apertures are formed in the substrate, copper or another conductive material is typically laminated or otherwise deposited on the substrate, and subsequently imaged and etched to form the final circuit patterns. For single sided back bared designs, etching typically requires a resist layer to be deposited over the apertures on the opposing side of the substrate to protect the copper from being back etched.

For double sided PWBs, the metal layers may instead be deposited on both sides and in the through holes in the substrate simultaneously using various adhesiveless metallization processes such as a metallized through hole process which is the subject matter of U.S. Pat. Nos. 5,112,462 and 5,137,791 to Swisher, which are incorporated by reference herein to the extent necessary to support this disclosure. In brief, the Swisher processes include the steps of forming a thin, random and non-continuous metal oxide layer on a substrate, vapor depositing a first layer of conductive material thereon, and electroplating additional conductive material over the vapor deposited conductive layer. Metallized materials produced by the Swisher processes are offered by Sheldahl, Inc. of Northfield, Minn. under the trademark NOVACLAD®.

Once conductive layers are formed on the substrate, cover layers are typically deposited on one or both sides thereof to insulate the circuit patterns. Typically, a dielectric film that is pre-punched with apertures at desired locations is bonded to the PWB through the use of adhesives. Alternatively, dielectric ink may be selectively screen printed and cured on the surfaces of the PWB to form the required cover layers.

Many of the above processes for providing apertures such as through holes in substrates or access apertures in substrates or cover layers are limited in aperture size, resolution and registration precision. Moreover, many of these processes are not readily suited for roll-to-roll operation, and may require separate tooling for each circuit design, as well as additional processing steps.

In addition, for back bared applications, many of the above processes are limited in the formation of access openings which are larger than their respective contact pads, particularly on the back side of a PWB (i.e., through the substrate). Many applications such as surface mount designs require full clearance around contact pads (i.e., spacing between the contact pad and the walls of the access aperture). Since access apertures are typically pre-punched in a substrate, full clearance access apertures may not be constructed without complex and expensive processing since the etching step for forming the contact pads typically occurs prior to depositing the cover layer on the opposing side of the conductive layer.

In some applications, apertures may be formed in the substrate subsequent to the formation of conductive layers thereon, e.g. by laser skiving. However, many laser skiving processes are cost prohibitive for many flexible PWB applications, and still may not provide full clearance contact pads as there is typically no simple way of preventing the laser process from etching straight through a cover layer once an aperture is formed in a substrate.

One material which has been found to provide cover layers with high resolution and registrability is photoimageable coverlay material (PIC), such as Pyralux® PC flexible composite photoimageable coverlay material manufactured by du Pont. Photoimageable coverlay materials are typically flexible acrylic dry films used as coverlays in flexible printed wiring board applications. Most PIC materials are negative working photosensitive materials which cure upon exposure to light within a specified spectral range, similar to many photoresist materials. PIC materials typically may be vacuum laminated, separated from their release film, and subsequently exposed and developed by conventional photoresist processes. Once exposed and developed to form a desired pattern, most PIC materials may be thermally cured to achieve their final properties.

PIC materials typically offer improved resolution and registration precision of cover layers and access pads thereon, typically as low as 125 micron apertures or less. Furthermore, PIC materials are more compatible with roll-to-roll processes, and often require less tooling cost since they use much of the same machinery as photoresists, requiring only custom artwork for exposing the apertures. However, PIC materials have heretofore only been used for coverlay materials, so the resolution, clearance and manufacturing limitations discussed above for dielectric film substrates are still limiting factors on conventional printed wiring boards which utilize PIC coverlays.

Therefore, a need exists in the art for printed wiring boards and methods of manufacture therefor having higher resolution and registration of access apertures and through holes in coverlayers and base substrates thereof, and with reduced manufacturing complexity and cost. Moreover, there is a need for a process which provides access apertures in a substrate with full clearance around contact pads on both sides of the substrate.

SUMMARY OF THE INVENTION

The invention addresses these and other problems associated with the prior art in providing printed wiring boards and methods of manufacture therefor which utilize photoimageable dielectric material (PID) as base substrates therefor. Many different PWB designs may be constructed using the preferred PID substrates without significant modifications to conventional processes and machinery required for manufacturing conventional PWB designs. Consequently, the invention allows the advantages attained by PID materials, including improved resolution and registration precision, and reduced manufacturing complexity and cost, to be incorporated into conventional PWB processes in a simple and cost effective manner.

Therefore, in accordance with one aspect of the invention, a printed wiring board is provided including a substrate including a photoimageable dielectric material with at least one aperture; a circuit pattern of conductive material disposed on a surface of the substrate; and an insulating layer disposed on the substrate surface overlapping at least a portion of the circuit pattern.

In accordance with another aspect of the invention, a printed wiring board is provided including a substrate including a photoimageable dielectric material with at least one aperture; and first and second conductive layers disposed on opposing surfaces of the substrate and electrically interconnected through conductive material disposed in the substrate aperture.

According to a further aspect of the invention, a method of making a printed wiring board is provided, which includes the steps of forming a circuit pattern on a base substrate including a photoimageable dielectric material; and making at least one aperture in the substrate by imaging and developing the photoimageable dielectric material.

In accordance with another aspect of the invention, a method of making a printed wiring board is provided, including the steps of forming a first conductive layer on one side of a base substrate including a photoimageable dielectric material; forming a second conductive layer on the other side of the base substrate; and making at least one aperture in the substrate by imaging and developing the photoimageable dielectric material.

These and other advantages and features, which characterize the invention, are set forth in the claims annexed hereto and forming a further part hereof. However, for a better understanding of the invention, and the objectives and advantages obtained by its use, reference should be made to the drawing, and to the following descriptive matter, in which there is described a preferred embodiment of the invention.

BRIEF DESCRIPTION OF THE DRAWING

In the Drawing, which forms a part of the instant specification, embodiments of the invention are shown. Like numerals are employed in the various views to indicate like parts:

FIGS. 2(a)-2(b) are cross-sectional views showing several steps used in forming an alternate cover layer on the printed wiring board of FIGS. 1(a)-1(d);

FIGS. 4(a)-4(c) are cross-sectional views showing several steps in the manufacture of a double sided printed wiring board with a photoimageable dielectric substrate consistent with the invention.

DETAILED DESCRIPTION OF THE PREFERRED EMBODIMENTS

Figure 1A:
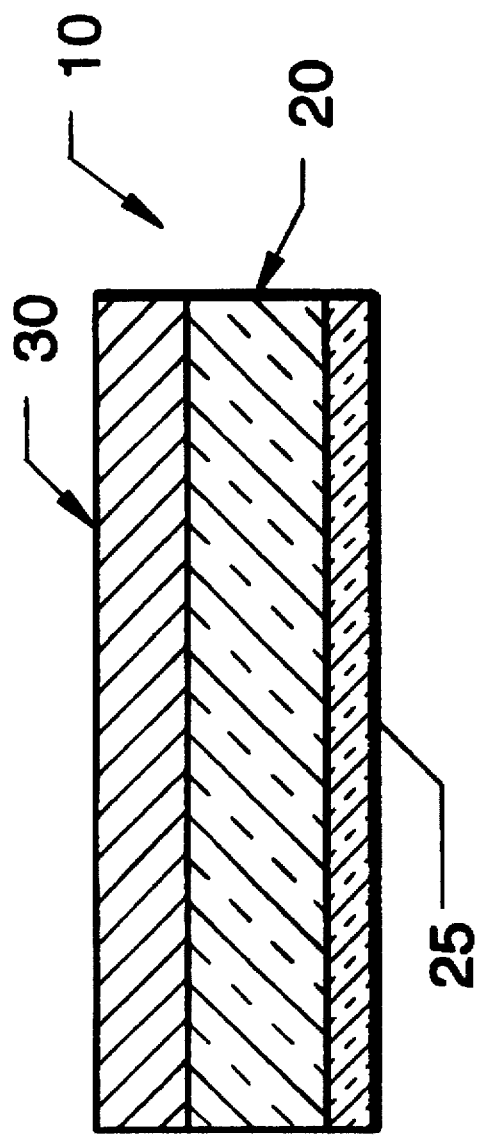
FIGS. 1(a)-1(d) are cross-sectional views showing several steps in the manufacture of a single sided back bared printed wiring board with a photoimageable dielectric substrate consistent with the invention.

A photoimageable dielectric material (PID) is used as the base substrate material in various printed wiring board designs consistent with the invention. The PID material is preferably Pyralux® PC flexible photoimageable coverlay material described above and heretofore used for forming cover layers on printed wiring boards. PID material is typically provided in thicknesses between 25 to 64 microns (1 to 2.5 mils), and is typically sold as a dry film with a plastic (e.g., polyester or polyethylene) release liner. The release liner may be opaque or translucent. A translucent release liner enables imaging to be performed through the liner. On the other hand, an opaque release liner protects the PID material from exposure prior to and between processing steps.

The preferred PID material is processed by exposing a negative image with collimated ultraviolet light using approximately 300 millijoules of energy, then developing the material to remove unexposed portions with an alkaline, preferably potassium carbonate, solution, and finally temperature curing the material in a convection oven, preferably at about 150° for about 90 minutes. Shorter durations are also possible using an infrared oven in a nitrogen atmosphere. The preferred PID material has an advantage in that all the tooling required for exposing and developing the material is conventionally found in typical photoresists and curing processes.

Other photoimageable dielectric materials may be used as a base substrate in the alternative, many of which may have different process requirements consistent with their use. Thus, the use of a Pyralux® PC material as the preferred base substrate is provided merely for the purposes of illustration.

The use of a PID material as a substrate provides several advantages beyond the advantages attained by the use of such a material as a coverlay. For example, apertures for use in accessing conductive circuit traces (e.g., access apertures) or for interconnecting two conductive layers (e.g., conductive through holes) may be constructed in the substrate having improved resolution and registration precision, but without any significant manufacturing complexity and cost. The number, shapes and clearances around apertures which may be formed in a PID substrate are flexible. Moreover, the use of the PID material as a substrate is compatible with many conventional roll-to-roll processes.

In addition, using a PID substrate provides a great deal of design flexibility, since the preferred PID material may be used with many different printed wiring board designs known in the art, including single sided, double sided, multi-layer, rigid flex, etc., and variations thereof. Accordingly, several examples of printed wiring designs are provided herein for illustrating the principles of the invention.

For example, a single sided back bared PWB 10 is shown in FIGS. 1(a)–1(d). The first step in the manufacture of PWB 10 is to vacuum laminate a copper foil 30 with a PID material 20 (shown with release liner 25 disposed thereon). The PID material may be any thickness (e.g. about 25 to 64 microns) consistent with different performance factors such as dielectric strength, impedance control, etc. Moreover, the copper foil may be provided in various thicknesses, such as 12 to 70 microns. Furthermore, other conductive materials besides copper, such as silver, gold, etc. may also be used.

Copper layer 30 is preferably bonded to PID 20 without the use of adhesives, relying on the adhesive nature of the PID material to bond to the copper foil. By eliminating the use of adhesives, the resulting PWB is thinner, more flexible, and more resistant to solvents and other caustic chemicals.

Other adhesiveless metal deposition processes may be used alternative to laminating a copper foil to the PID. Examples include vapor deposition, sputtering, and other metal deposition processes such as the Swisher process described above. In this case, finished copper foil thicknesses down to about 5 microns are possible.

Figure 1B:
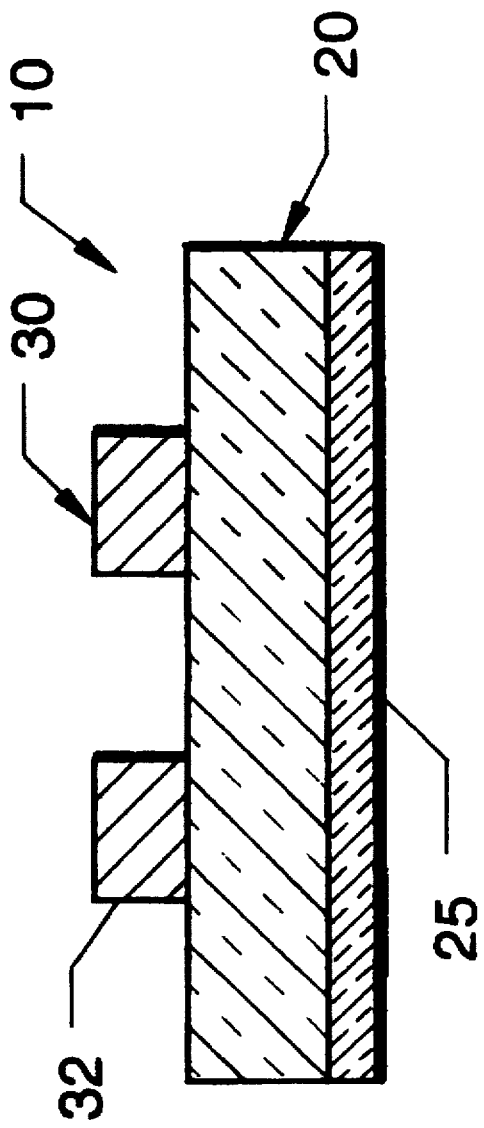

As shown in FIG. 1(b), once the copper foil and PID substrate are laminated to one another, copper foil 30 is preferably etched to form a circuit pattern thereon, including contact pads and circuit traces, such as circuit trace 32. Etching of copper foil 30 may be performed by various known processes. For example, in a photoresist process, a photoresist material is deposited by lamination, screen printing, coating or electroplating onto the copper foil. Next, the photoresist is photoimaged and developed to form a mask over the copper foil. Next, the copper foil is etched using a solvent to remove selective portions thereof and form the desired circuit pattern. Once the desired circuit pattern is formed, the remaining photoresist is then stripped from the board.

Other known etching processes may be used in the alternative, such as utilizing screen printed resists. In addition, other techniques such as additive or semi-additive processes, as well as other adhesiveless or adhesive-based metal deposition technologies, may also be used instead of laminating and etching the copper foil as described herein.

Figure 1C:
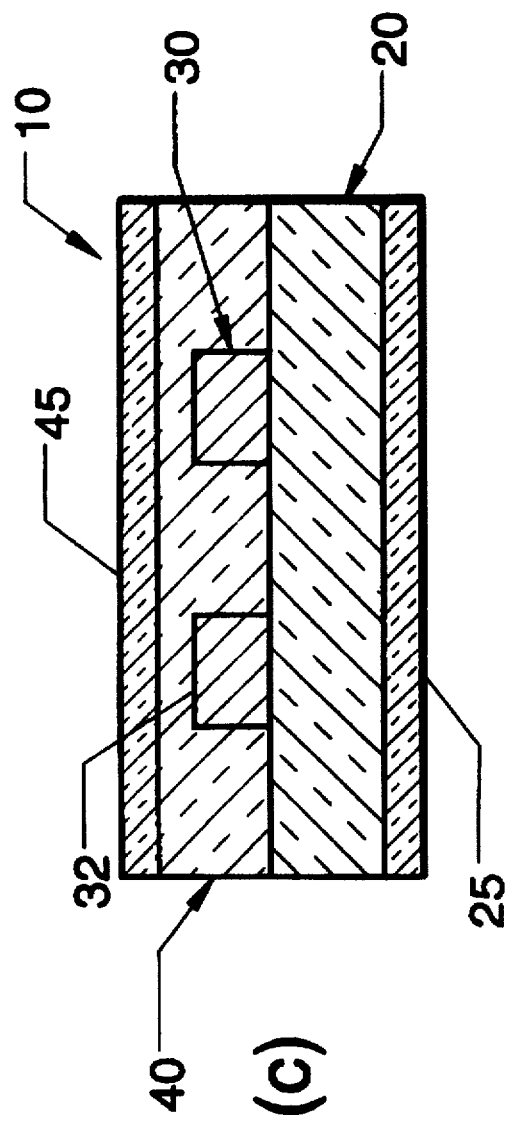
Figure 1D:
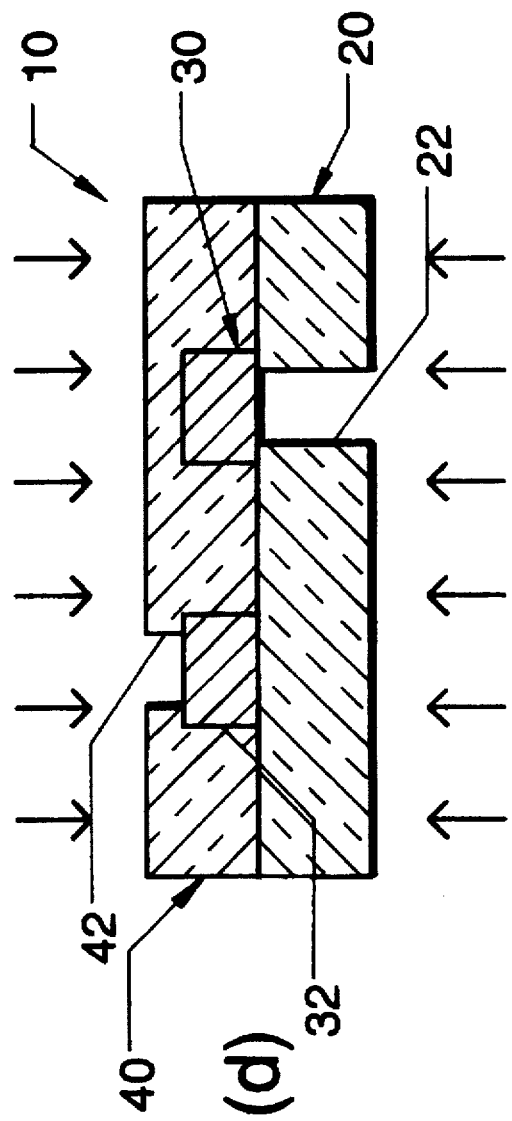

The preferred process next proceeds to an insulating layer deposition step shown in FIG. 1(c). In this step, insulating layer, or cover layer, 40 is laminated over conductive layer 30 to fully encapsulate the conductive layer on both sides thereof.

Insulating layer 40 is preferably a photoimageable coverlay material having a release liner 45. Insulating layer 40 may be the identical material to that used for substrate 20, whereby a nearly homogeneous encapsulation of conductive layers 30 may be provided. Other photoimageable coverlays may be used in the alternative.

As shown in FIG. 1(c), insulating layer 40 is preferably a cover layer that is laminated over conductive layer 30 using a vacuum lamination step similar to the lamination operation performed between conductive layers 30 and PID substrate 20. Alternatively, as shown in FIGS. 2(a)–2(b) for printed wiring board 10', a conventional pre-punched or pre-drilled dielectric film cover layer 50 may be used in the alternative. As shown in FIG. 2(a), dielectric film cover layer 50 includes pre-punched or pre-drilled apertures 52, and is laminated over conductive layers 30 using an adhesive 55. However, it has been found that pre-formed cover layers are usually not capable of providing the same resolution and registration precision as PIC material, and are therefore not as preferable. Furthermore, other insulating layer technologies, such as screen printing dielectric inks, spraying, roll coating, curtain coating, etc., may also be used.

Returning to FIG. 1(d), once insulating layer 40 is laminated to PID substrate 20 with conductive layers 30 interposed therebetween, an imaging and developing step is used to form apertures 22 in substrate 20 and to form apertures 42 in insulating layer 40. In this step, release liners 25 and 45 are removed if opaque, or alternatively may be left on during imaging if they are formed from a translucent material. The desired images are first exposed on the PID substrate material and the PIC coverlay material with the desired artwork for forming the required access apertures therein. Once exposed, the material is developed and unexposed portions are washed away. Then, PWB 10 may be thermally cured as described above.

For a back bared design as shown in FIGS. 1(a)–1(d), imaging may be performed simultaneously on both sides of PWB 10 using suitable artwork for each side, or alternatively in separate imaging steps. For a non-back bared single sided design (with or without a coverlayer), only one side of a printed wiring board need be imaged and developed to form the requisite access apertures on one side of the board. Also, as described above, in the alternate construction 10' of FIG. 2(b), the imaging and developing steps need only be performed on substrate material 20 since apertures 52 are formed in cover layer 50 prior to being deposited on PWB 10'.

Several alternative process steps may be used consistent with the invention. For example, the PID substrate material 20 may be imaged and developed prior to application of copper by sputtering, vacuum metallization, etc. as previously described. Moreover, a second conductive layer may be formed on substrate 20 to make a double sided design. Other standard/conventional processes known in the art may also be used consistent with the invention.

The preferred construction provides several advantages over conventional designs. For example, improved resolution may be provided for the access apertures in substrate 20 and cover layer 40. For example, access apertures as small as 125 microns or less may be constructed, as opposed to 400 microns which is typical for pre-punched substrate and cover layer apertures.

Furthermore, misalignment of apertures with contact pads is greatly reduced due to the greater registration precision provided by the PID base substrate material. Adhesive squeeze-out, which is characteristic of lamination-type processes, may also be eliminated.

In addition, the number and shapes of apertures provided in the substrate is more flexible. For instance, square, rectangular, etc. shaped apertures may be provided in close proximity to one another using the preferred material and processes. On the other hand, much of the prior art is limited in the ability to provide other than standard circular apertures due to the complexity and cost of the tooling required.

Also, as discussed above, significantly less complex and expensive processing is required for the preferred PID base substrate material. Typically, the tooling is the same as is used for photoresist processes, and custom artwork is all that is required for forming apertures in a custom design, as opposed to prior art processes which typically require entirely new tools for each design. Further, the processing is more compatible with roll-to-roll processing, so less complex handling machinery and processes are required.

Figure 3:
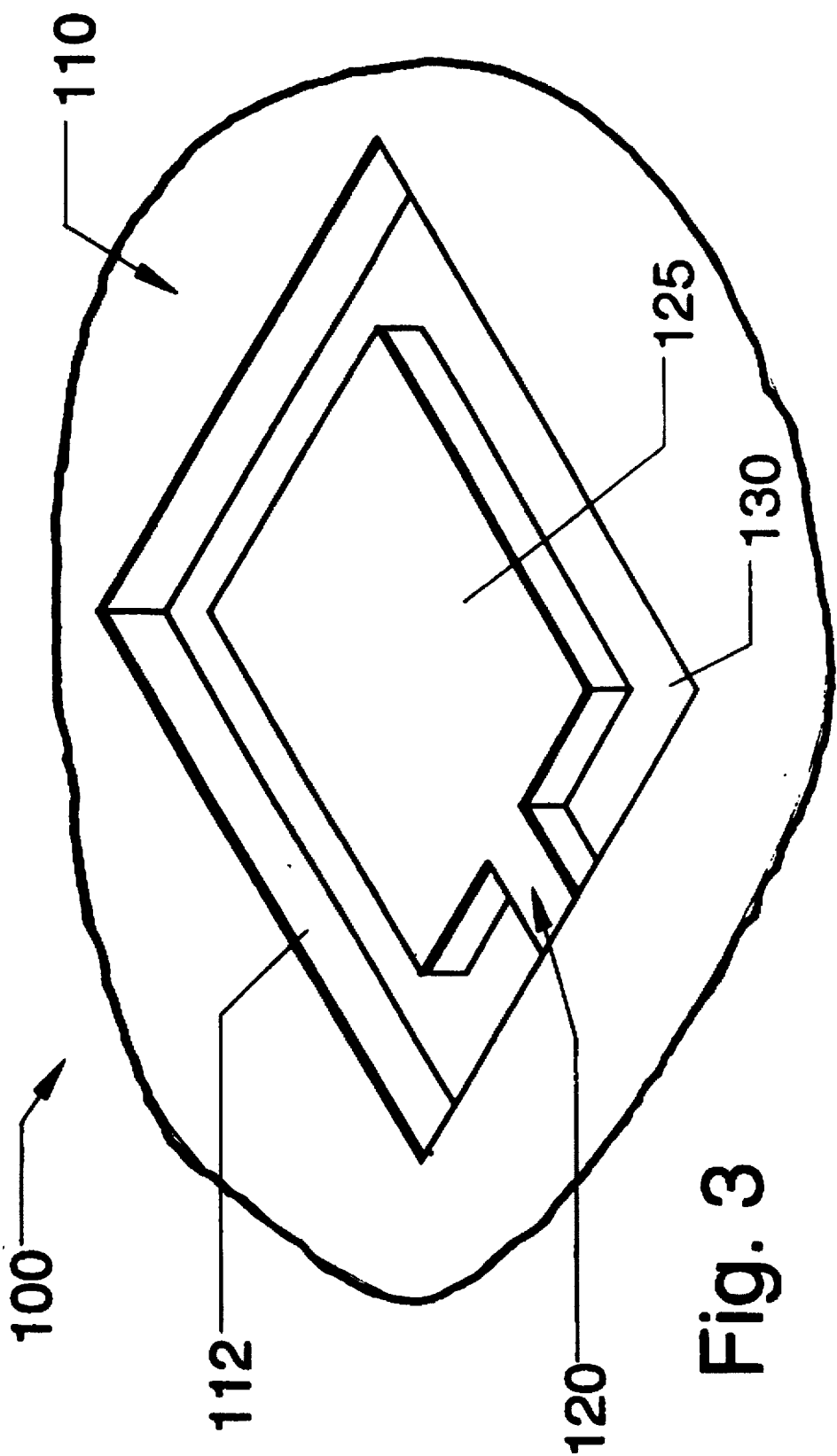
FIG. 3 is a partial fragmentary perspective view of a contact pad on a bottom surface of a back bared printed wiring board constructed consistent with the invention, wherein the access opening therefor provides full clearance around the contact pad.

An additional advantage from the invention is illustrated in FIG. 3. As discussed above, many surface mount designs require full clearance around contact pads, which is typically not possible on back bared surfaces (i.e., through the substrate) with conventional processing techniques since apertures in a substrate are typically formed prior to depositing a supporting cover layer. However, through the use of the preferred process, full clearance contact pads maybe constructed using a suitable mask since the apertures are formed in a substrate after a supporting cover layer is deposited on the opposing surface thereof. Consequently, the contact pad is supported by the cover layer when the aperture is formed in the substrate.

For example, as shown in FIG. 3, an aperture 112 may be formed in a substrate 110 on the bottom surface of printed wiring board 100. Full clearance may be provided around contact pad 125 formed in conductive layer 120, with the contact pad being fully supported by cover layer 130.

FIGS. 4(a)-(c) illustrate a double sided printed wiring board design consistent with the invention. As shown in FIG. 4(a), a double sided printed wiring board 60 includes a PID substrate material 70 with a release liner 75 included thereon. The first step in the manufacture of board 60 is to adhesivelessly deposit a conductive layer 80 on the PID substrate material 70 opposite release liner 75. Various metallization processes, including the above-described Swisher process, may be used consistent with the invention. Other metallization techniques, such as sputtering, ion plating, electroplating, screen printing, electroless deposition, physical vapor deposition, chemical vapor deposition, etc. may also be used.

Next, as shown in FIG. 4(b), release liner 75 is removed, and then a number of through holes, such as through hole 72, are formed in PID substrate 70 by an imaging and developing step as discussed above with reference to FIG. 1(d). During the imaging and developing step, it is believed that apertures, such as aperture 82, will similarly be formed in conductive layer 80 since no support for the conductive material will be provided once the substrate material is removed. However, it may also be necessary to perform a separate copper etching step to remove the conductive material proximate apertures 82.

Using the preferred process, it is believed that high resolution and accurate through holes may be possible, such as 25 to 75 micron through holes with up to a 1 to 1 aspect ratio. Furthermore, unlike laser drilling, no soot or other contamination would typically be generated, and the resulting apertures would tend to be of relatively high quality with relatively straight walls.

Next, as shown in FIG. 4(c), a conductive layer 90 is deposited on the opposite side of substrate 70 and additional conductive material 92 is deposited in aperture 72 to electrically interconnect layers 80 and 90. The additional conductive material may be deposited by any of the above-described adhesiveless deposition steps.

The resulting double sided PWB 60 includes unetched copper foil circuit layers 80 and 90 electrically interconnected at desired points by metallized through holes 92. Standard circuit processes such as imaging and etching the copper layers, depositing cover layers, etc., may then be performed to finish the assembly.

It is believed that the resulting double sided circuit board 60 may be used in most applications where double sided PWBs are typically used. For example, the double sided PWB may be bonded to similar boards with an anisotropic adhesive to form a multilayer construction. Other applications, such as MCM designs and other technologies may also be benefitted by the use of the preferred double sided PWB.

Various alternative processes may be utilized consistent with the invention. For example, PID substrate material 70 may be imaged and developed prior to depositing any conductive material thereon, thus enabling the copper deposition steps to occur at the same time for both sides of the substrate. Moreover, conductive material may be deposited on both sides of substrate 70 via an adhesiveless deposition process or a lamination process prior to imaging and developing the PID based substrate material. Once the copper is deposited on both sides of substrate 20, the copper layers may be imaged and etched to form the desired circuit patterns and to form apertures exposing base substrate material 20. Then, the substrate material may be imaged and developed to form the through hole apertures between the conductive layers, whereby additional copper may then be deposited to electrically interconnect the opposing layers. It will be appreciated that various additional or alternative processing steps may also be used in the alternative.

Several advantages may also be provided by the preferred double sided PWB design. For example, high resolution through holes, and precise registration thereof, is generally available through the use of the preferred PID material. Moreover, the production processes are inexpensive and simple compared to other pre-drilling and pre-punching operations. Moreover, the PID material provides good performance and chemical resistance for most flexible PWB applications.

It will therefore be appreciated that the invention provides an alternative substrate material which may be used in most applications wherein prior dielectric materials have typically been used. Therefore, various modifications and changes may be made to these preferred embodiments without departing from the spirit and scope of the invention.

What is claimed is:

1. A method of making a printed wiring board, comprising the steps of:
   (a) forming a conductive layer on a first side of a base substrate comprising an unimaged photoimageable dielectric material;
   (b) patterning the conductive layer to form a circuit pattern therein after the conductive layer is formed on the base substrate; and
   (c) making at least one aperture in a second side of the base substrate by imaging and developing the photoimageable dielectric material.

2. The method of claim 1, wherein the forming step comprises the step of laminating a copper foil to the substrate and wherein the patterning step comprises the step of etching the copper foil to form the circuit pattern.

3. The method of claim 1, wherein the forming step comprises the step of depositing a conductive material on the substrate through an adhesiveless interconnection.

4. The method of claim 1, wherein the making step further comprises the step of thermally curing the photoimageable dielectric material.

5. The method of claim 1, further comprising the step of, after the conductive layer is patterned, forming an insulating layer over at least a portion of the circuit pattern.

6. The method of claim 5, wherein the insulating layer forming step comprises the steps of laminating a photoimageable coverlay material over the circuit pattern and forming apertures in the insulating layer by imaging and developing the photoimageable coverlay material.

7. The method of claim 6, wherein the apertures formed in the substrate and the coverlay are less than about 400 microns in width.

8. The method of claim 6, wherein the coverlay and the substrate are imaged and developed with the circuit pattern interposed therebetween.

9. The method of claim 8, wherein the circuit pattern includes a contact pad, and wherein the making step comprises the step of making an aperture in the substrate that is aligned with, and provides full clearance around, the contact pad in the circuit pattern.

10. The method of claim 1, wherein the photoimageable dielectric material is a negative working photosensitive material provided in a dry film form and having a thickness of about 25 to 64 microns.

11. The method of claim 10, wherein the photosensitive material is an acrylic polymer.

12. The method of claim 1, wherein circuit pattern is a first circuit pattern, the method further comprising the steps of forming a second circuit pattern on the second side of the substrate, and forming conductive material in the aperture in the substrate to electrically interconnect the first and second circuit patterns.

13. The method of claim 12, wherein the aperture in the substrate is about 25 to 75 microns in width.

14. The method of claim 13, wherein the making step includes the steps of imaging and developing the photoimageable dielectric material through a translucent release liner, and subsequently removing the release liner.

15. A method of making a printed wiring board, comprising the steps of:

(a) forming a first conductive layer on one side of a base substrate comprising an unimaged photoimageable dielectric material;

(b) patterning the first conductive layer to form a first circuit pattern therein after the conductive layer is formed on the base substrate;

(c) forming a second conductive layer on the other side of the base substrate; and (d) making at least one aperture in the substrate by imaging and developing the photoimageable dielectric material.

16. The method of claim 13, further comprising the step of forming conductive material in the aperture in the substrate to electrically interconnect the first and second conductive layers.

17. The method of claim 15, further comprising the step of thermally curing the photoimageable dielectric material.

18. The method of claim 15, wherein the making step is performed before the second conductive layer is formed on the substrate.

19. A method of making a printed wiring board, comprising the steps of:

(a) forming a conductive layer on a base substrate comprising an unimaged photoimageable dielectric material;

(b) depositing a photoresist over the conductive layer;

(c) imaging the photoresist with a desired circuit pattern for the conductive layer; and (d) after the conductive layer is formed on the base substrate, imaging the photoimageable dielectric material with a desired access opening pattern in the base substrate.

20. The method of claim 19, wherein the photoresist and photoimageable dielectric material imaging steps are performed simultaneously.

21. The method of claim 19, wherein the photoresist imaging step is performed before the photoimageable dielectric material imaging step.

22. The method of claim 19, further comprising the steps of developing the photoresist and etching the conductive layer to form the desired circuit pattern in the conductive layer.

23. The method of claim 19, further comprising the step of developing the photoimageable dielectric material to form the desired access opening pattern in the base substrate.

* * * * *